United States Patent
Chen et al.

(10) Patent No.: US 11,908,732 B2
(45) Date of Patent: Feb. 20, 2024

(54) ALTERNATING SPACERS FOR PITCH STRUCTURE

(71) Applicant: INTERNATIONAL BUSINESS MACHINES CORPORATION, Armonk, NY (US)

(72) Inventors: Hsueh-Chung Chen, Cohoes, NY (US); Chanro Park, Clifton Park, NY (US); Koichi Motoyama, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 223 days.

(21) Appl. No.: 17/475,829

(22) Filed: Sep. 15, 2021

(65) Prior Publication Data
US 2023/0080746 A1    Mar. 16, 2023

(51) Int. Cl.
| | |
|---|---|
| *H01L 21/768* | (2006.01) |
| *G03F 1/38* | (2012.01) |
| *H01L 21/033* | (2006.01) |
| *H01L 21/308* | (2006.01) |

(52) U.S. Cl.
CPC .......... *H01L 21/76816* (2013.01); *G03F 1/38* (2013.01); *H01L 21/0337* (2013.01); *H01L 21/3088* (2013.01)

(58) Field of Classification Search
CPC ............. H01L 21/0332; H01L 21/0334; H01L 21/0335; H01L 21/0337; H01L 21/0338; H01L 21/3088
See application file for complete search history.

(56) References Cited

U.S. PATENT DOCUMENTS

| | | | |
|---|---|---|---|
| 8,865,598 B2 | 10/2014 | Sant et al. | |
| 8,916,472 B2 | 12/2014 | Hu et al. | |
| 9,287,135 B1 | 3/2016 | Doris et al. | |
| 9,305,782 B2 | 4/2016 | Zhou et al. | |
| 9,627,389 B1* | 4/2017 | Woo ................ | H01L 21/823431 |
| 9,673,055 B2 | 6/2017 | Anderson et al. | |
| 9,831,117 B2 | 11/2017 | Wu et al. | |
| 9,911,646 B2 | 3/2018 | Tsai et al. | |
| 2015/0243503 A1* | 8/2015 | Leobandung ..... | H01L 21/28132 |
| | | | 438/427 |

OTHER PUBLICATIONS

Lee et al., "Multi-patterning strategies for navigating the sub-5 nm frontier, part 1", Aug. 2019, pp. 1-8.

(Continued)

*Primary Examiner* — Walter H Swanson
(74) *Attorney, Agent, or Firm* — Tutunjian & Bitetto, P.C.; Samuel Waldbaum

(57) ABSTRACT

A method of forming a pitch pattern is provided. The method includes forming two adjacent mandrels separated by a first distance, D1, on a substrate, and forming a first set of alternating sidewall spacers between the two adjacent mandrels. The method further includes removing the two adjacent mandrels, and forming a second set of alternating sidewall spacers and a third set of alternating sidewall spacers on opposite sides of the first set of sidewall spacers.

15 Claims, 10 Drawing Sheets

(56) References Cited

OTHER PUBLICATIONS

Li et al. "Fabrication of sub-20 nm patterns using dopamine chemistry in self-aligned double patterning." Nanoscale 10.44, Sep. 2018, pp. 1-7.
Preil, "The Need for Multiple Alternatives for sub-20 nm Lithography", Future Fab International, Jul. 2011, pp. 1-12.
Raley et al., "A spacer-on-spacer scheme for self-aligned multiple patterning and integration", SPIE, The International Society for Optics and Photonics, Aug. 2016, pp. 1-3.

* cited by examiner

ALTERNATING SPACERS FOR PITCH STRUCTURE

BACKGROUND

The present invention generally relates to forming mandrels and spacers, and more particularly to sub-20 nanometer (nm) pitch spacer patterns.

Multiple patterning has been used to fabricate integrated circuits and metal line spacing using photolithography. Self-aligned contact and via patterning is a method for patterning multiple contacts or vias from a single lithographic feature. Atomic layer deposition can be used as a film formation technique that can deposit one atomic/molecular layer at a time for precise thickness control. Trench patterns have been used for back-end-of-line processing for metal lines.

SUMMARY

In accordance with an embodiment of the present invention, a method of forming a pitch pattern is provided. The method includes forming two adjacent mandrels separated by a first distance, D1, on a substrate, and forming a first set of alternating sidewall spacers between the two adjacent mandrels. The method further includes removing the two adjacent mandrels, and forming a second set of alternating sidewall spacers and a third set of alternating sidewall spacers on opposite sides of the first set of sidewall spacers.

In accordance with another embodiment of the present invention, a method of forming a pitch pattern is provided. The method includes forming two adjacent mandrels separated by a first distance, D1, on a substrate, and forming a first sidewall spacer on opposite sides of each of the two adjacent mandrels, wherein the first sidewall spacers are made of a first material. The method further includes forming a second sidewall spacer adjoining each of the first sidewall spacers, where the second sidewall spacers are made of a second material different from the first material, and forming a third sidewall spacer adjoining each of the second sidewall spacers, where the third sidewall spacers are made of the first material. The method further includes forming a fourth sidewall spacer adjoining each of the third sidewall spacers, where the fourth sidewall spacers are made of the second material.

In accordance with yet another embodiment of the present invention, a pitch pattern is provided. The pitch pattern includes a first set of sidewall spacers alternating with a second set of sidewall spacers, wherein each of the sidewall spacers have approximately the same width, and wherein the first set of sidewall spacers are a different material from the second set of sidewall spacers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate to using alternating spacers to multiply pitches, where a pitch structure of sub-20 nanometers (nm) can be achieved. At extremely small pitches, for example at or below 14 nm, it is extremely difficult to transfer a pattern multiple times to reliably have both a 7 nm line and a 7 nm space.

Embodiments of the present invention relate to not using the first or second spacers formed for self-aligned quadruple patterning (SAQP) or self-aligned octuple patterning (SAOP) as the mandrels for next pitch scaling.

Embodiments of the present invention provide a method of achieving sub-20 nm pitch structure utilizing a single (one) mask an patterning step. Various embodiments provide combining a fat mandrel with pitch multiplying of, for example, 2 times, where the 1st pitch multiplying is in the space between fat mandrels, and the 2nd pitch multiplying is by removing the fat mandrels and repeating pitch multiplying within the vacated mandrel space. For example, every three metal lines can have the same width with a sub-20 nm pitch, or every n metal lines can have the same width. The patterning method may control the ratio of metal critical dimension (CD) to space precisely, where the spacing may be controlled within the tolerances of atomic layer deposition (ALD) type processes.

Embodiments of the present invention provide every n line having the same CD and spacing, and the ability to change pattern pitches and spacing by changing the thickness of spacers and mandrels. Mandrels can be removed and the provided space used to form additional spacers.

In various embodiments, the first mandrel can be defined by a relaxed pitch patterning process to resolve the difficulty of pillar patterning in conventional self-align multiple patterning techniques.

Exemplary applications/uses to which the present invention can be applied include, but are not limited to: back-end-of line (BEOL) metallization patterning for semiconductor devices.

It is to be understood that aspects of the present invention will be described in terms of a given illustrative architecture; however, other architectures, structures, substrate materials and process features and steps can be varied within the scope of aspects of the present invention.

Figure 1:
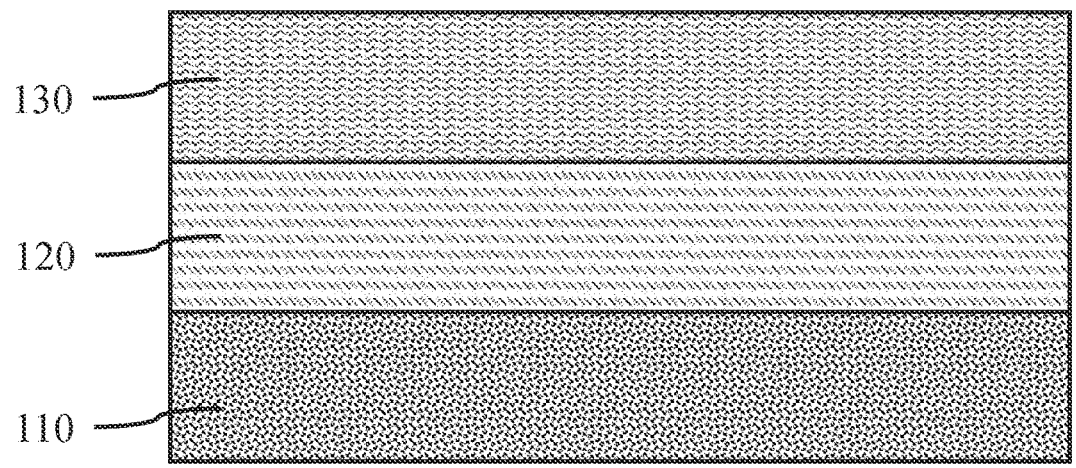
FIG. 1 is a cross-sectional side view showing a mandrel layer on a metal layer, and a resist layer formed on the mandrel layer, in accordance with an embodiment of the present invention.

Referring now to the drawings in which like numerals represent the same or similar elements and initially to FIG. 1, FIG. 1 is a cross-sectional side view showing a mandrel layer on a metal layer, and a resist layer formed on the mandrel layer, in accordance with an embodiment of the present invention.

In one or more embodiments, a mandrel layer 120 can be formed on an underlying metal layer 110, where the mandrel layer can be formed by a blanket deposition, for example, chemical vapor deposition (CVD), plasma enhanced CVD (PECVD), physical vapor deposition (PVD), and combinations thereof. In various embodiments, for example, a seed layer and/or a barrier layer may be deposited by a CVD/PECVD process and a bulk mandrel layer can be deposited by PVD.

In various embodiments, the mandrel layer 120 can be made of an insulating dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), amorphous silicon (a-Si), amorphous carbon (a-C), and combinations thereof. The material of the mandrel layer 120 can be selected based on etch electivity relative to the material(s) of other layers and features.

In various embodiments, the metal layer 110 can be on a semiconductor substrate.

In various embodiments, the metal layer 110 can be made of a conducting material, including, but not limited to, copper (Cu), tungsten (W), molybdenum (Mo), cobalt (Co), nickel (Ni), aluminum (Al), tantalum (Ta), titanium (Ti), tantalum nitride (TaN), titanium nitride (TiN), tungsten nitride (WN), and combinations thereof.

In one or more embodiments, a lithographic resist layer 130 can be formed on the top surface of the mandrel layer 120, where the lithographic resist layer can be multiple material layers, including, but not limited to, resin resist materials, hardmask materials, softmask materials, silicon antireflection coating(s) (SiARC), optical planarization layers (OPL), and combinations thereof. The hardmask material(s) can include but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof.

Figure 2:
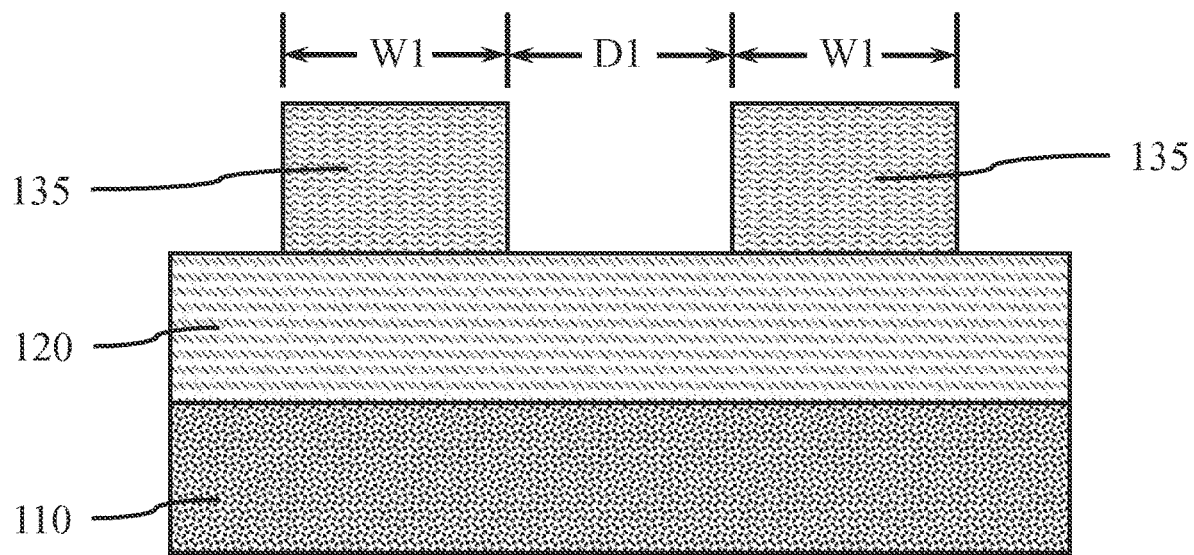
FIG. 2 is a cross-sectional side view showing a pattern of resist templates formed on the template layer and metal layer, in accordance with an embodiment of the present invention.

FIG. 2 is a cross-sectional side view showing a pattern of resist templates formed on the template layer and metal layer, in accordance with an embodiment of the present invention.

In one or more embodiments, the lithographic resist layer 130 can be patterned and etched to form one or more resist templates 135 on the template layer 120, where a plurality of resist templates can have a predetermined pitch with a distance, D1, between facing sidewalls of adjacent resist templates 135, and a predetermined width, W1. In various embodiments, the distance, D1, can be approximately the same as the width, W1, within the tolerances of the process(es) used to form the resist templates 135.

In various embodiments, the distance, D1, can be in a range of about 3 nanometers (nm) to about 120 nm, or about 10 nm to about 100 nm, or about 30 nm to about 60 nm, although other distances are also contemplated. The distances may be based on the pitch between gates of underlying devices.

In various embodiments, the width(s), W1, can be in a range of about 3 nanometers (nm) to about 120 nm, or about 10 nm to about 100 nm, or about 30 nm to about 60 nm, although other widths are also contemplated. The widths may be based on the pitch between source/drain contacts of underlying devices.

Figure 3:
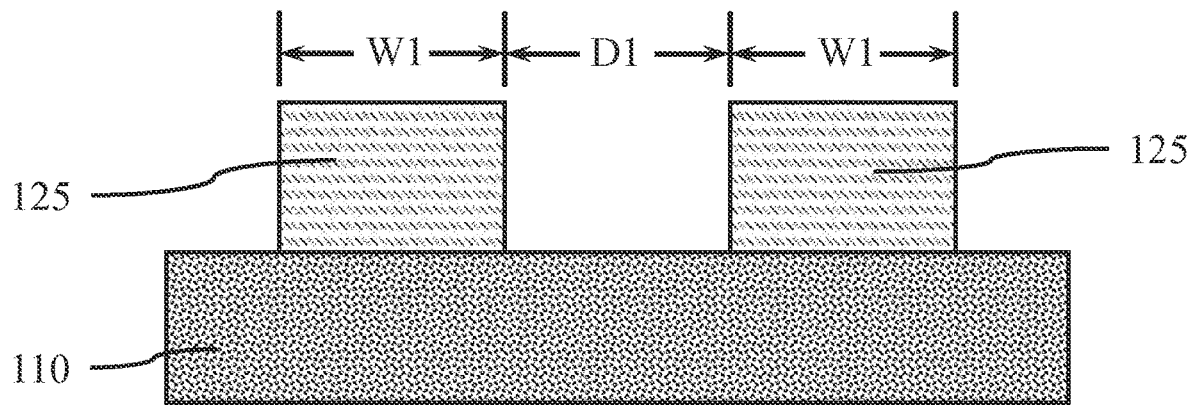
FIG. 3 is a cross-sectional side view showing the pattern of resist templates transferred to the template layer to form a plurality of mandrels, in accordance with an embodiment of the present invention.

FIG. 3 is a cross-sectional side view showing the pattern of resist templates transferred to the template layer to form a plurality of mandrels, in accordance with an embodiment of the present invention.

In one or more embodiments, the pattern of resist templates 135 transferred to the template layer 120 to form a plurality of mandrels 125, where the pattern of the resist templates can be transferred using a selective, directional etch, for example, a reactive ion etch (RIE). In various embodiments, the mandrels 125 can have approximately the same widths, W1, and spacing distances, D1, as the resist templates 135, where the size and positioning would be within the tolerances of the process(es) used to transfer the pattern from the resist templates 135 to the mandrel layer 120. Two adjacent mandrels 125 can be separated by a first distance, D1, on the metal layer 110 and substrate.

Figure 4:
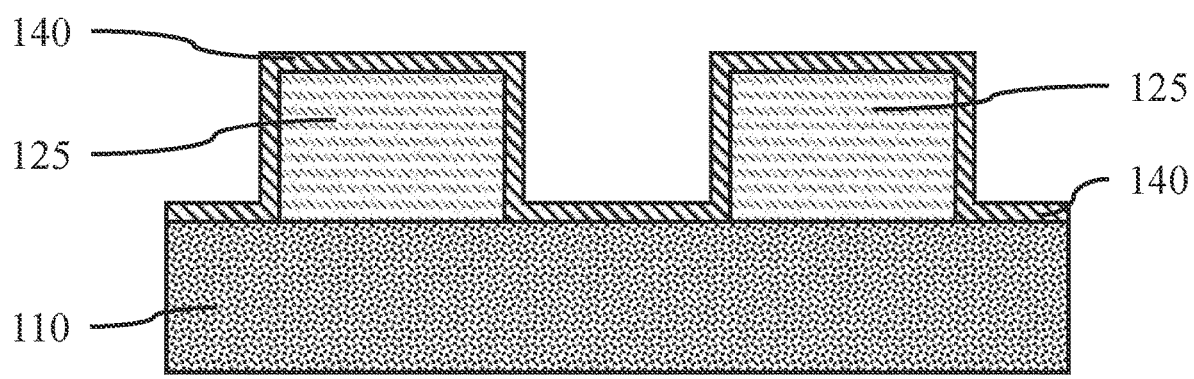
FIG. 4 is a cross-sectional side view showing a first spacer layer formed on the plurality of mandrels and exposed surfaces of the metal layer, in accordance with an embodiment of the present invention.

FIG. 4 is a cross-sectional side view showing a first spacer layer formed on the plurality of mandrels and exposed surfaces of the metal layer, in accordance with an embodiment of the present invention.

In one or more embodiments, a first spacer layer 140 can be formed on the plurality of mandrels 125 and exposed surfaces of the metal layer 110, where the first spacer layer 140 can be formed by a conformal deposition, for example, atomic layer deposition (ALD), plasma enhanced ALD (PEALD), and combinations thereof.

In various embodiments, the first spacer layer 140 can be made of silicon oxide (SiO) or silicon nitride (SiN). The material of the first spacer layer 140 can be can be selectively removed relative to the material of the mandrels 125.

In various embodiments, the first spacer layer 140 can have a thickness in a range of about 0.5 nm to about 20 nm, or about 5 nm to about 10 nm, where the first spacer layer 140 can have a predetermined thickness intended to form a first sidewall spacer with a width a fraction of the distance, D1, between the adjacent mandrels.

In various embodiments, the distance, D1, can be selected to be three times (3×) the final pitch, and the sidewall spacer thickness formed from the first spacer layer 140 can be half of the final pitch. Conversely, the thickness of the spacer thickness formed from the first spacer layer 140 can be as much as one-sixth (⅙) the final pitch, where the width (thickness) is a half pitch.

Figure 5:
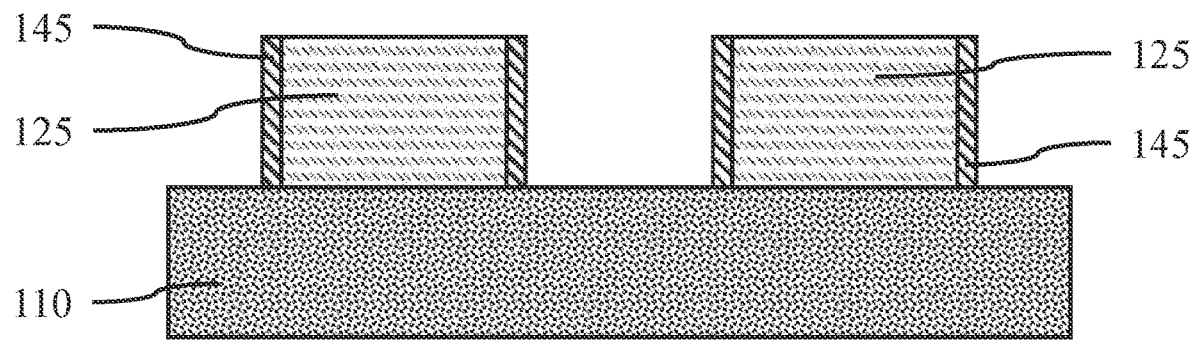
FIG. 5 is a cross-sectional side view showing portions of the first spacer layer removed to form first sidewall spacers on the plurality of mandrels, in accordance with an embodiment of the present invention.

FIG. 5 is a cross-sectional side view showing portions of the first spacer layer removed to form first sidewall spacers on the plurality of mandrels, in accordance with an embodiment of the present invention.

In one or more embodiments, portions of the first spacer layer 140 can be removed from the top surface of the mandrels 125 and the top surface of the metal layer 110 to form first sidewall spacers 145 on the plurality of mandrels 125. The portions of the first spacer layer 140 can be removed using a selective directional etch (e.g., RIE) to leave the portion of the first spacer layer 140 on the sidewalls of the mandrels 125.

Figure 6:
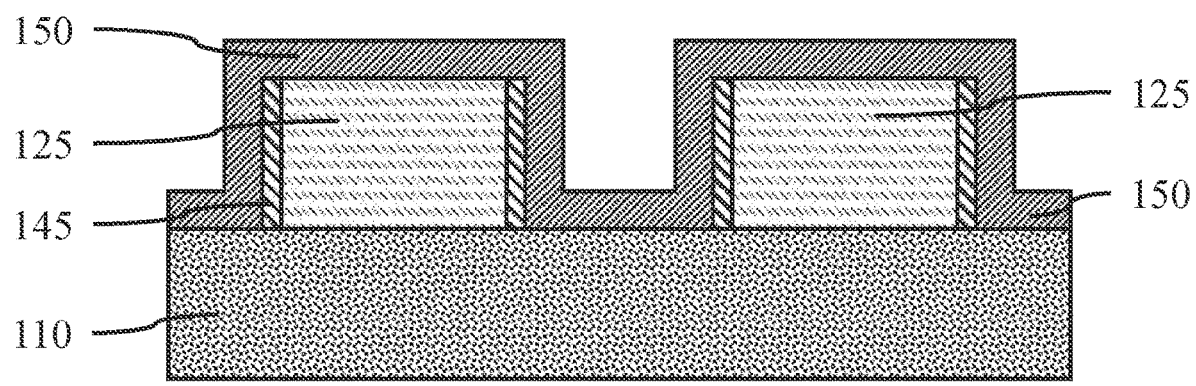
FIG. 6 is a cross-sectional side view showing a second spacer layer formed on the plurality of first sidewall spacers, mandrels, and exposed surfaces of the metal layer, in accordance with an embodiment of the present invention.

FIG. 6 is a cross-sectional side view showing a second spacer layer formed on the plurality of first sidewall spacers, mandrels, and exposed surfaces of the metal layer, in accordance with an embodiment of the present invention.

In one or more embodiments, a second spacer layer 150 can be formed on the plurality of first sidewall spacers 145, the exposed top surfaces of the plurality of mandrels 125, and exposed surfaces of the metal layer 110 between the first sidewall spacers 145. The second spacer layer 150 can be formed by a conformal deposition, for example, atomic layer deposition (ALD), plasma enhanced ALD (PEALD), and combinations thereof.

In various embodiments, the second spacer layer 150 can be made of a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), amorphous silicon (a-Si), amorphous carbon (a-C), a spin-on organic film/OPL, and combinations thereof. The material of the second spacer layer 150 can be selected based on etch electivity relative to the material(s) of the mandrel layer 120 and mandrels 125, the first spacer layer 140 and first sidewall spacers 145, and subsequently formed layers and features.

In a non-limiting exemplary embodiment, the second spacer layer 150 can be made of silicon nitride (SiN) deposited by ALD, where the first spacer layer 140 and first sidewall spacers 145 are made of silicon oxide (SiO) deposited by ALD, and the mandrel layer 120 and mandrels 125 are made of amorphous silicon (a-Si).

In another non-limiting exemplary embodiment, the second spacer layer 150 can be made of OPL, the first spacer layer 140 and first sidewall spacers 145 are made of silicon oxide (SiO) deposited by ALD, and the mandrel layer 120 and mandrels 125 are made of amorphous silicon (a-Si).

In various embodiments, the second spacer layer 150 can have a thickness in a range of about 0.5 nm to about 20 nm, or about 5 nm to about 10 nm, where the second spacer layer 150 can have a predetermined thickness intended to form a second sidewall spacer with a width a fraction of the distance, D1, between the adjacent mandrels. In various embodiments, the second spacer layer 150 can be twice the thickness (2×) as the first spacer layer 140.

In various embodiments, the distance, D1, can be selected to be three times (3×) the final pitch, and the sidewall spacer thickness formed from the second spacer layer 150 can be half of the final pitch. Conversely, the thickness of the spacer thickness formed from the second spacer layer 150 can be as much as one-sixth (⅙) the final pitch, where the width (thickness) is a half pitch.

Figure 7:
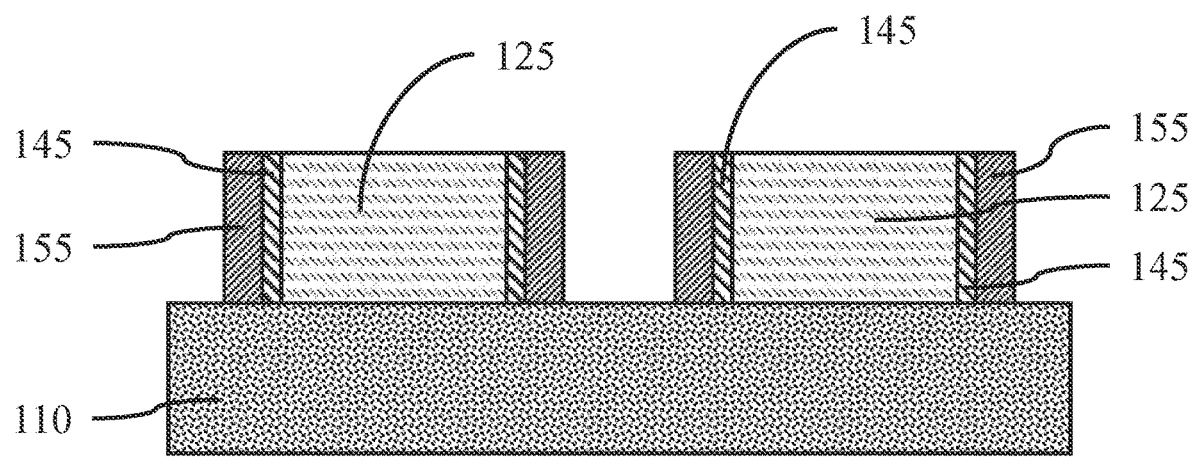
FIG. 7 is a cross-sectional side view showing portions of the second spacer layer removed to form second sidewall spacers on the plurality of first sidewall spacers and mandrels, in accordance with an embodiment of the present invention.

FIG. 7 is a cross-sectional side view showing portions of the second spacer layer removed to form second sidewall spacers on the plurality of first sidewall spacers and mandrels, in accordance with an embodiment of the present invention.

In one or more embodiments, portions of the second spacer layer 150 can be removed from the top surface of the mandrels 125 and the top surface of the metal layer 110 to form second sidewall spacers 155 on the plurality of first sidewall spacers 145. The portions of the second spacer layer 150 can be removed using a selective directional etch (e.g., RIE) to leave the portion of the second spacer layer 150 on the sidewalls of the first sidewall spacers 145.

Figure 8:
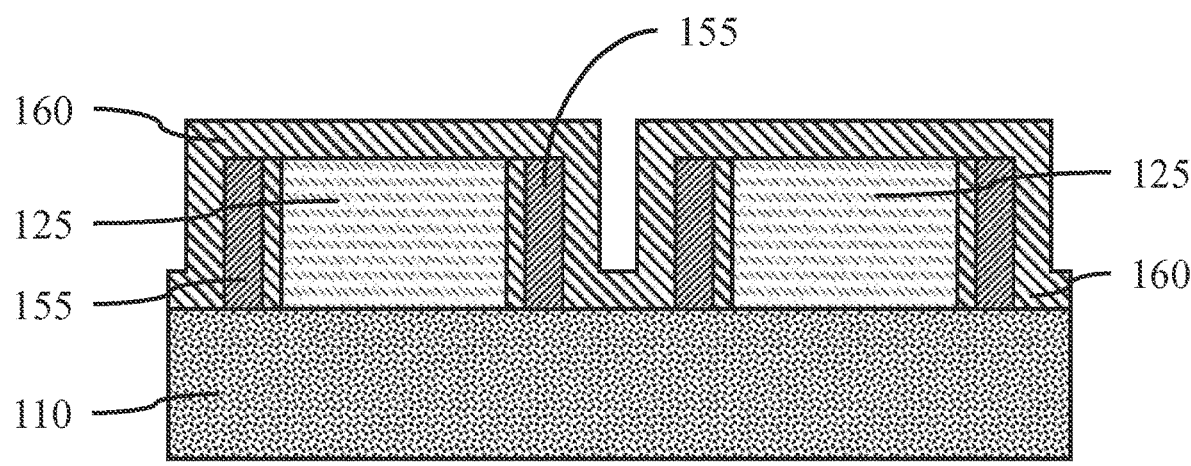
FIG. 8 is a cross-sectional side view showing a third spacer layer formed on the plurality of first and second sidewall spacers, mandrels, and exposed surfaces of the metal layer, in accordance with an embodiment of the present invention.

FIG. 8 is a cross-sectional side view showing a third spacer layer formed on the plurality of first and second sidewall spacers, mandrels, and exposed surfaces of the metal layer, in accordance with an embodiment of the present invention.

In one or more embodiments, a third spacer layer 160 can be formed on the plurality of second sidewall spacers 155, first sidewall spacers 145, the exposed top surfaces of the plurality of mandrels 125, and exposed surfaces of the metal layer 110 between the second sidewall spacers 155. The third spacer layer 160 can be formed by a conformal deposition, for example, atomic layer deposition (ALD), plasma enhanced ALD (PEALD), and combinations thereof.

In various embodiments, the third spacer layer 160 can be made of silicon oxide (SiO) or silicon nitride (SiN). The material of the third spacer layer 160 can be can be selectively removed relative to the material of the mandrels 125 and the second sidewall spacers 155. The material of the third spacer layer 160 can be the same material as the first spacer layer 140, so the first sidewall spacers 145 and third sidewall spacers can be removed with the same selective etching chemistry/process.

In various embodiments, the third spacer layer 160 can have a thickness in a range of about 0.5 nm to about 20 nm, or about 5 nm to about 10 nm, where the third spacer layer 160 can have a predetermined thickness intended to form a third sidewall spacer with a width a fraction of the distance, D1, between the adjacent mandrels 125. In various embodiments, the third spacer layer 160 can be the same thickness as the second spacer layer 150.

In various embodiments, the distance, D1, can be selected to be three times (3×) the final pitch, and the sidewall spacer thickness formed from the third spacer layer 160 can be half of the final pitch. Conversely, the thickness of the spacer thickness formed from the third spacer layer 160 can be as much as one-sixth (⅙) the final pitch, where the width (thickness) is a half pitch.

Figure 9:
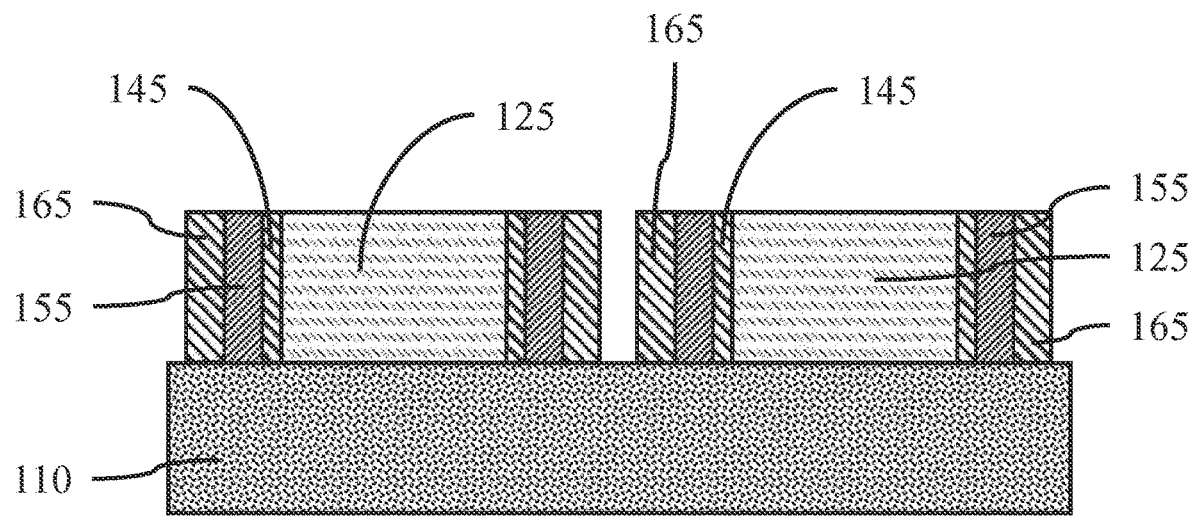
FIG. 9 is a cross-sectional side view showing portions of the third spacer layer removed to form third sidewall spacers on the plurality of second sidewall spacers, in accordance with an embodiment of the present invention.

FIG. 9 is a cross-sectional side view showing portions of the third spacer layer removed to form third sidewall spacers on the plurality of second sidewall spacers, in accordance with an embodiment of the present invention.

In one or more embodiments, portions of the third spacer layer 160 can be removed from the top surface of the mandrels 125 and the top surface of the metal layer 110 to form third sidewall spacers 165 on the plurality of second sidewall spacers 155. The portions of the third spacer layer 160 can be removed using a selective directional etch (e.g., RIE) to leave the portion of the third spacer layer 160 on the sidewalls of the second sidewall spacers 155.

Figure 10:
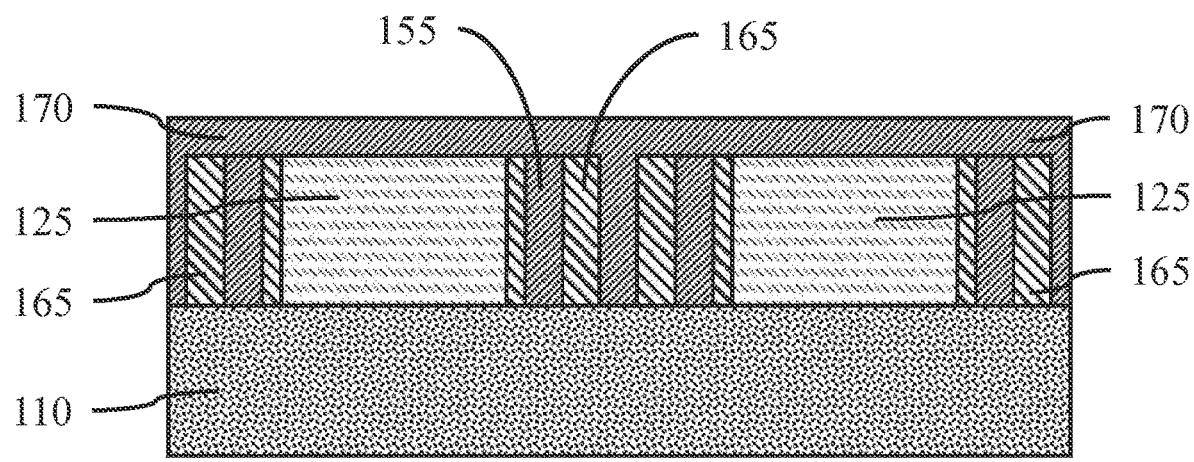
FIG. 10 is a cross-sectional side view showing a fourth spacer layer formed on the plurality of first, second, and third sidewall spacers, mandrels, and exposed surfaces of the metal layer, in accordance with an embodiment of the present invention.

FIG. 10 is a cross-sectional side view showing a fourth spacer layer formed on the plurality of first, second, and third sidewall spacers, mandrels, and exposed surfaces of the metal layer, in accordance with an embodiment of the present invention.

In one or more embodiments, a fourth spacer layer 170 can be formed on the plurality of third sidewall spacers 165, second sidewall spacers 155, first sidewall spacers 145, the exposed top surfaces of the plurality of mandrels 125, and exposed surfaces of the metal layer 110 between the third sidewall spacers 165. The fourth spacer layer 170 can be formed by a conformal deposition, for example, atomic layer deposition (ALD), plasma enhanced ALD (PEALD), and combinations thereof.

In various embodiments, the fourth spacer layer 170 can be made of a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), amorphous silicon (a-Si), amorphous carbon (a-C), a spin-on organic film/OPL, and combinations thereof. The material of the fourth spacer layer 170 can be selected based on etch electivity relative to the material(s) of the mandrel layer 120 and mandrels 125, the first spacer layer 140 and first sidewall spacers 145, the third spacer layer 160 and third sidewall spacers 165, and subsequently formed layers and features. In various embodiments, the fourth spacer layer 170 can be the same material as the second spacer layer 150 and second sidewall spacers 155, so the second sidewall spacers 155 and fourth sidewall spacers can be removed with the same selective etching chemistry/process.

In various embodiments, the fourth spacer layer 170 can have a thickness in a range of about 0.5 nm to about 20 nm, or about 5 nm to about 10 nm, where the fourth spacer layer 170 can have a predetermined thickness intended to fill in the remaining fraction of the distance, D1, between the adjacent third sidewall spacers 165. In various embodiments, the fourth spacer layer 170 can be the same thickness as the third spacer layer 160.

In various embodiments, the distance, D1, can be selected to be three times (3×) the final pitch, and the sidewall spacer thickness formed from the fourth spacer layer 170 can be half of the final pitch. Conversely, the thickness of the spacer thickness formed from the fourth spacer layer 170 can be as much as one-sixth (⅙) the final pitch, where the width (thickness) is a half pitch.

Figure 11:
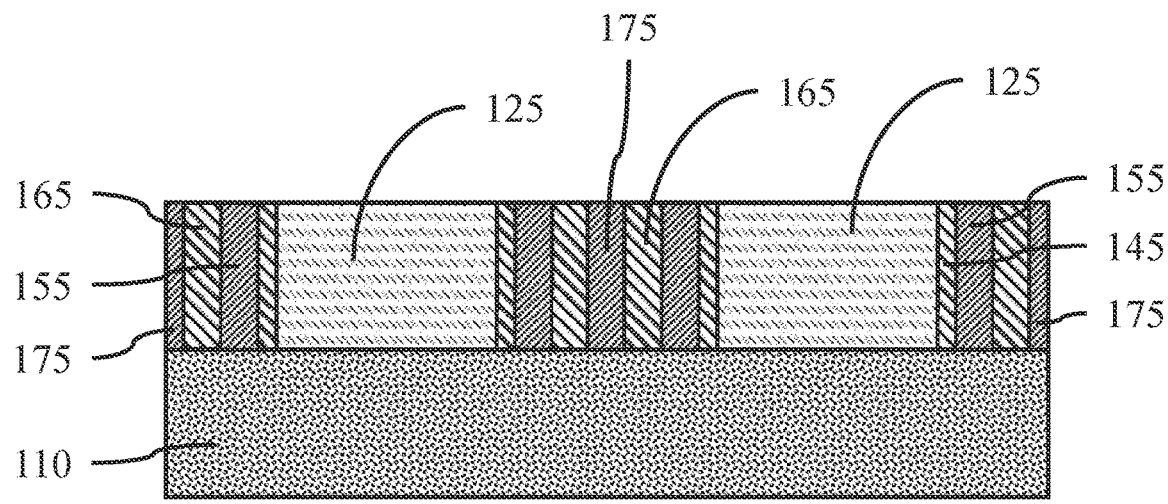
FIG. 11 is a cross-sectional side view showing portions of the fourth spacer layer removed to form fourth sidewall spacers on the plurality of third sidewall spacers, in accordance with an embodiment of the present invention.

FIG. 11 is a cross-sectional side view showing portions of the fourth spacer layer removed to form fourth sidewall spacers on the plurality of third sidewall spacers, in accordance with an embodiment of the present invention.

In one or more embodiments, portions of the fourth spacer layer 170 can be removed from the top surface of the mandrels 125 and the top surface of the metal layer 110 to form fourth sidewall spacers 1675 on the plurality of third sidewall spacers 165. The portions of the fourth spacer layer 170 can be removed using a selective directional etch (e.g., RIE) to leave the portion of the fourth spacer layer 170 on the sidewalls of the third sidewall spacers 165.

In various embodiments, the individual sidewall spacers 145, 155, 165, 175 formed between the two adjacent mandrels can form a first set of alternating sidewall spacers, where the adjoining sidewall spacers have bee made by separate deposition processes. The first set of alternating sidewall spacers can include an odd number of individual sidewall spacers 145, 155, 165, 175, where a center sidewall spacer, for example, fourth sidewall spacer 175 can be a single sidewall spacer, and the other sidewall spacers can be formed as pairs. The first sidewall spacers 145 and third sidewall spacers 165 can form a first subset of individual sidewall spacers, and second sidewall spacers 155 and fourth sidewall spacer 175 can form a second subset of individual sidewall spacers, where the second subset of individual sidewall spacers can be made of a different material from the first subset of individual sidewall spacers. The material of the first subset of the individual sidewall spacers and the material of the second subset of the individual sidewall spacers can both be different from the material of the two adjacent mandrels.

While the embodiments have been illustrated as having seven individual sidewall spacers, this is for representational purposes only, and other numbers of individual sidewall spacers are also contemplated. The number of individual sidewall spacers can be based on the distance, D1, and the widths of the individual sidewall spacers.

Figure 12:
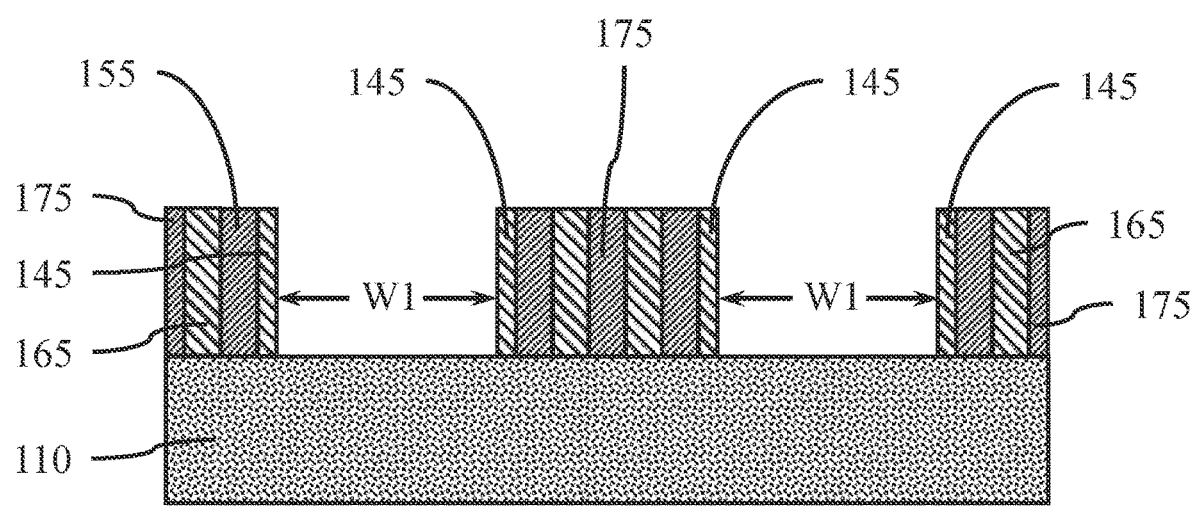
FIG. 12 is a cross-sectional side view showing the removal of the plurality of mandrels to expose portions of the top surface of the metal layer and facing sidewalls of the first sidewall spacers, in accordance with an embodiment of the present invention.

FIG. 12 is a cross-sectional side view showing the removal of the plurality of mandrels to expose portions of the top surface of the metal layer and facing sidewalls of the first sidewall spacers, in accordance with an embodiment of the present invention.

In one or more embodiments, the plurality of mandrels 125 can be removed to expose portions of the top surface of the metal layer 110 and facing sidewalls of the first sidewall spacers 145. The mandrels 125 can be removed using a selective, isotropic etch, for example, a wet chemical etch, a dry plasma etch, or a combination thereof.

In various embodiments, the width of the opening created by removing a mandrel 125 can be about the same as the width of the alternating sidewall spacers 145, 155, 165, 175.

Figure 13:
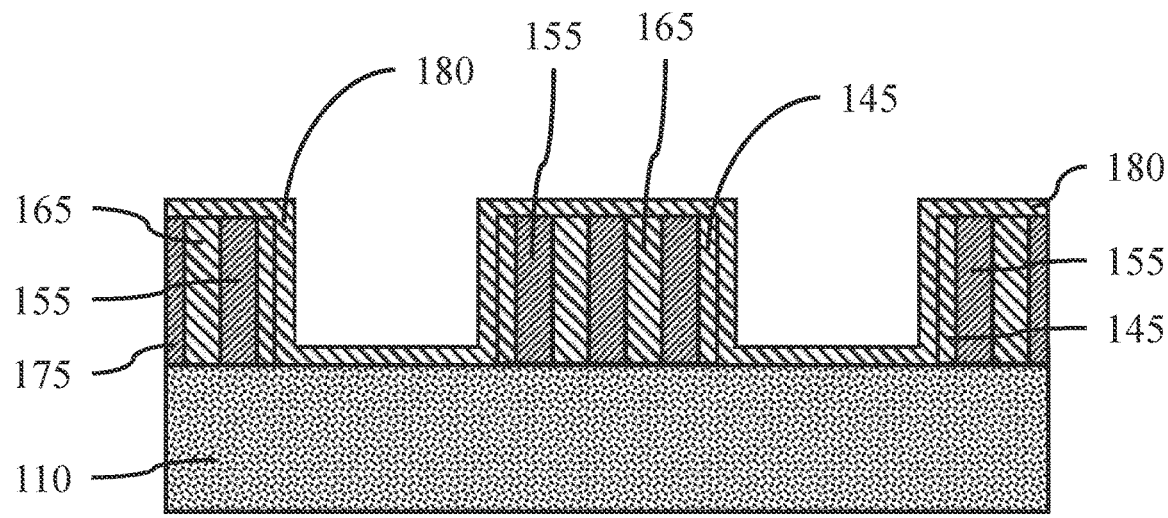
FIG. 13 is a cross-sectional side view showing a fifth spacer layer formed on the plurality of first, second, third, and fourth sidewall spacers, and exposed surfaces of the metal layer, in accordance with an embodiment of the present invention.

FIG. 13 is a cross-sectional side view showing a fifth spacer layer formed on the plurality of first, second, third, and fourth sidewall spacers, and exposed surfaces of the metal layer, in accordance with an embodiment of the present invention.

In one or more embodiments, a fifth spacer layer 180 can be formed on the sidewalls of the first sidewall spacers 145, and on the tops of the second sidewall spacers 155, third sidewall spacers 165, and fourth sidewall spacers 175, as well as the exposed surfaces of the metal layer 110 between the first sidewall spacers 145. The fifth spacer layer 180 can be formed by a conformal deposition, for example, atomic layer deposition (ALD), plasma enhanced ALD (PEALD), and combinations thereof.

In various embodiments, the fifth spacer layer 180 can be made of silicon oxide (SiO) or silicon nitride (SiN). The material of the fifth spacer layer 180 can be can be selectively removed relative to the material of the mandrels 125, second sidewall spacer 155, and fourth sidewall spacers 175. The material of the fifth spacer layer 180 can be the same as the material of the first sidewall spacers 145 and third sidewall spacers 165.

In various embodiments, the fifth spacer layer 180 can have a thickness in a range of about 0.5 nm to about 20 nm, or about 5 nm to about 10 nm, where the fifth spacer layer 180 can have a predetermined thickness intended to form a fifth sidewall spacer with a width a fraction of the width, W1, of the removed mandrels. In various embodiments, the fifth spacer layer 180 can be the same thickness as the first spacer layer 140, such that the combined thickness of the first sidewall spacer 145 and a fifth sidewall spacer can be the same as the thickness of a second sidewall spacer 155.

In various embodiments, the distance, W1, can be selected to be three times (3×) the final pitch, and the sidewall spacer thickness formed from the fifth spacer layer 180 can be half of the final pitch. Conversely, the thickness of the spacer thickness formed from the fifth spacer layer 180 can be as much as one-sixth (⅙) the final pitch, where the width (thickness) is a half pitch.

Figure 14:
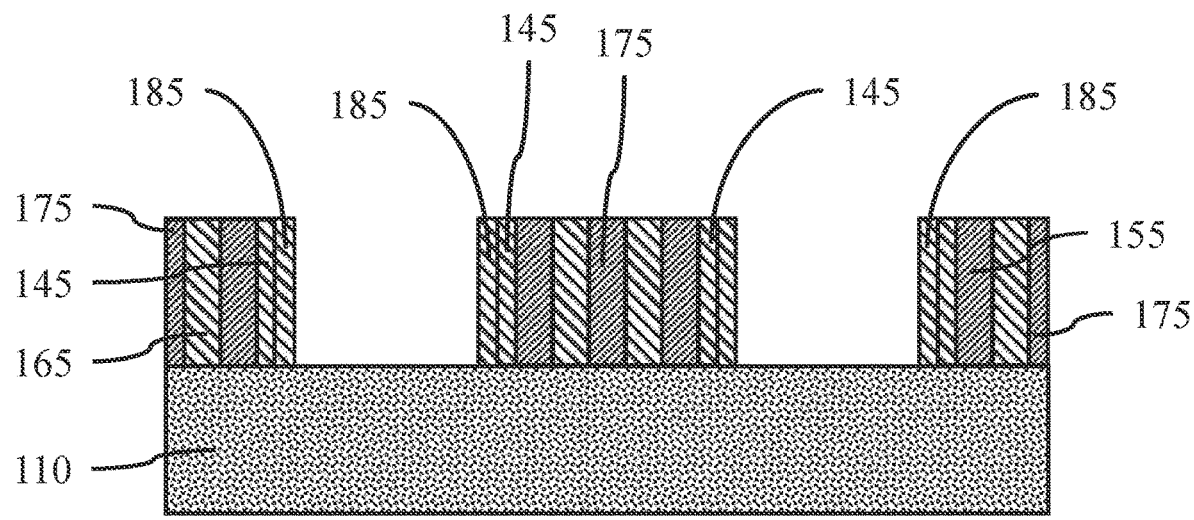
FIG. 14 is a cross-sectional side view showing portions of the fifth spacer layer removed to form fifth sidewall spacers on the plurality of first sidewall spacers, in accordance with an embodiment of the present invention.

FIG. 14 is a cross-sectional side view showing portions of the fifth spacer layer removed to form fifth sidewall spacers on the plurality of first sidewall spacers, in accordance with an embodiment of the present invention.

In one or more embodiments, portions of the fifth spacer layer 180 can be removed from the top surface of the metal layer 110 to form fifth sidewall spacers 185 on the plurality of first sidewall spacers 145. The portions of the fifth spacer layer 180 can be removed using a selective directional etch (e.g., RIE) to leave the portion of the fifth spacer layer 180 on the sidewalls of the first sidewall spacers 145.

Figure 15:
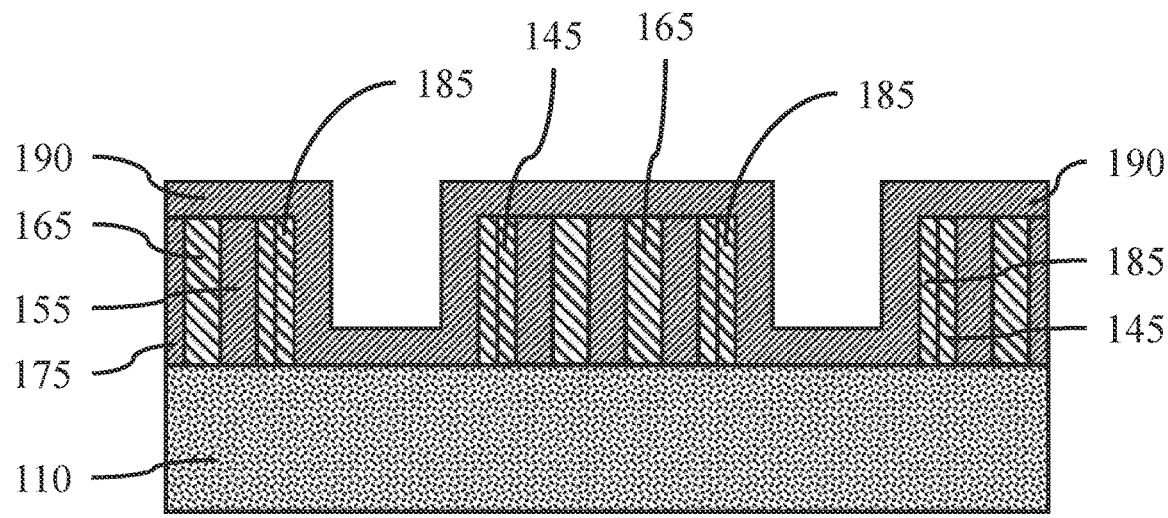
FIG. 15 is a cross-sectional side view showing a sixth spacer layer formed on the plurality of first, second, third, fourth, and fifth sidewall spacers, and exposed surfaces of the metal layer, in accordance with an embodiment of the present invention.

FIG. 15 is a cross-sectional side view showing a sixth spacer layer formed on the plurality of first, second, third, fourth, and fifth sidewall spacers, and exposed surfaces of the metal layer, in accordance with an embodiment of the present invention.

In one or more embodiments, a sixth spacer layer 190 can be formed on the sidewalls of the fifth sidewall spacers 185, and on the tops of the second sidewall spacers 155, third sidewall spacers 165, and fourth sidewall spacers 175, as well as the exposed surfaces of the metal layer 110 between the fifth sidewall spacers 185. The sixth spacer layer 190 can be formed by a conformal deposition, for example, atomic layer deposition (ALD), plasma enhanced ALD (PEALD), and combinations thereof.

In various embodiments, the sixth spacer layer 190 can be made of a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), amorphous silicon (a-Si), amorphous carbon (a-C), a spin-on organic film/OPL, and combinations thereof. The material of the sixth spacer layer 190 can be selected based on etch electivity relative to the material(s) of the mandrel layer 120 and mandrels 125, the first spacer layer 140 and first sidewall spacers 145, third sidewall spacers 165, and fifth sidewall spacers 185. The sixth spacer layer 190 can be made of the same material as the second spacer layer 150.

In various embodiments, the sixth spacer layer 190 can have a thickness in a range of about 0.5 nm to about 20 nm, or about 5 nm to about 10 nm, where the sixth spacer layer 190 can have a predetermined thickness intended to form a sixth sidewall spacer with a width a fraction of the width, W1, of the removed mandrels. In various embodiments, the sixth spacer layer 190 can be the same thickness as the second spacer layer 150.

In various embodiments, the distance, W1, can be selected to be three times (3×) the final pitch, and the sidewall spacer thickness formed from the sixth spacer layer 190 can be half of the final pitch. Conversely, the thickness of the spacer thickness formed from the sixth spacer layer 190 can be as much as one-sixth (⅙) the final pitch, where the width (thickness) is a half pitch.

Figure 16:
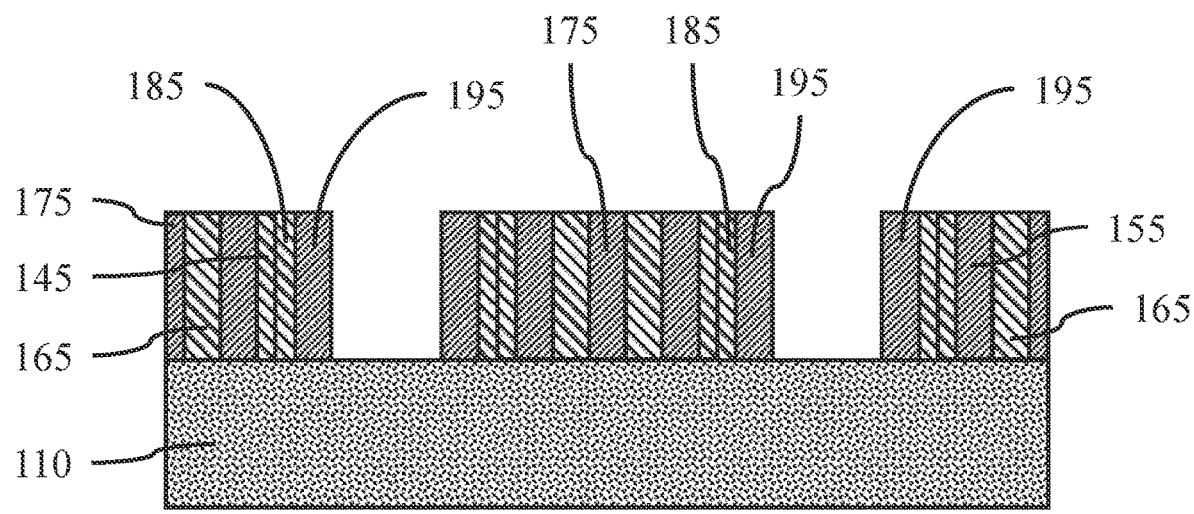
FIG. 16 is a cross-sectional side view showing portions of the sixth spacer layer removed to form sixth sidewall spacers on the plurality of fifth sidewall spacers, in accordance with an embodiment of the present invention.

FIG. 16 is a cross-sectional side view showing portions of the sixth spacer layer removed to form sixth sidewall spacers on the plurality of fifth sidewall spacers, in accordance with an embodiment of the present invention.

In one or more embodiments, portions of the sixth spacer layer 190 can be removed from the top surface of the metal layer 110 to form sixth sidewall spacers 195 on the plurality of fifth sidewall spacers 185. The portions of the sixth spacer layer 190 can be removed using a selective directional etch (e.g., RIE) to leave the portion of the sixth spacer layer 190 on the sidewalls of the fifth sidewall spacers 185.

Figure 17:
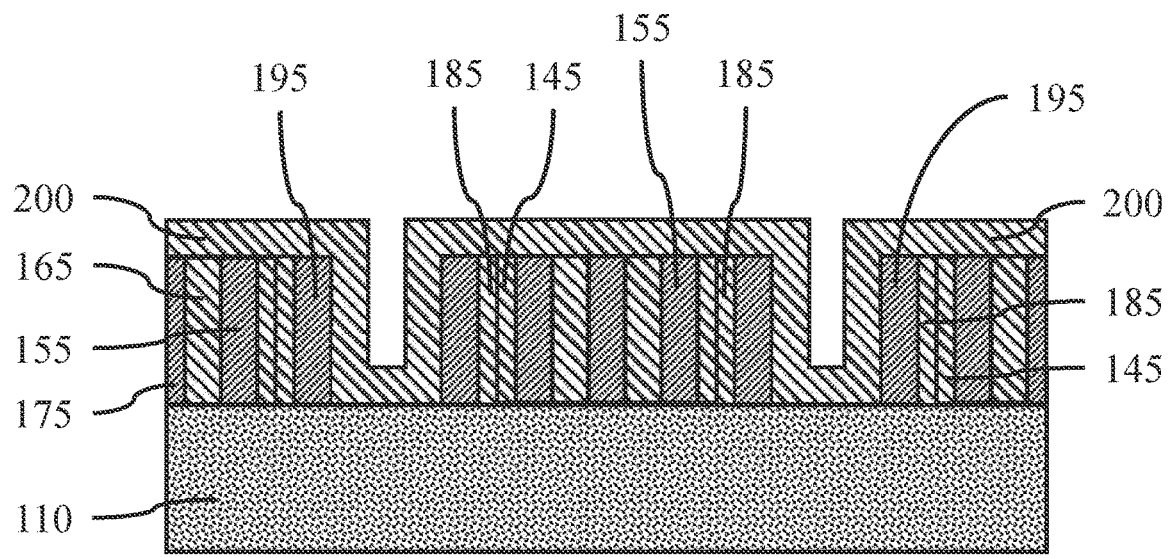
FIG. 17 is a cross-sectional side view showing a seventh spacer layer formed on the plurality of first, second, third, fourth, fifth, and sixth sidewall spacers, and exposed surfaces of the metal layer, in accordance with an embodiment of the present invention.

FIG. 17 is a cross-sectional side view showing a seventh spacer layer formed on the plurality of first, second, third, fourth, fifth, and sixth sidewall spacers, and exposed surfaces of the metal layer, in accordance with an embodiment of the present invention.

In one or more embodiments, a seventh spacer layer 200 can be formed on the sidewalls of the sixth sidewall spacers 195, and on the tops of the second sidewall spacers 155, third sidewall spacers 165, fourth sidewall spacers 175, and fifth sidewall spacers 185 as well as the exposed surfaces of the metal layer 110 between the sixth sidewall spacers 195. The seventh spacer layer 200 can be formed by a conformal deposition, for example, atomic layer deposition (ALD), plasma enhanced ALD (PEALD), and combinations thereof.

In various embodiments, the seventh spacer layer 200 can be made of silicon oxide (SiO) or silicon nitride (SiN). The material of the seventh spacer layer 200 can be can be selectively removed relative to the material of the sixth sidewall spacers 195.

In various embodiments, the seventh spacer layer 200 can have a thickness in a range of about 0.5 nm to about 20 nm, or about 5 nm to about 10 nm, where the seventh spacer layer 200 can have a predetermined thickness intended to form a seventh sidewall spacer with a width a fraction of the width, W1, of the removed mandrels. In various embodiments, the seventh spacer layer 200 can be about the same thickness as the sixth spacer layer 190.

In various embodiments, the distance, W1, can be selected to be three times (3×) the final pitch, and the sidewall spacer thickness formed from the seventh spacer layer 200 can be half of the final pitch. Conversely, the thickness of the spacer thickness formed from the seventh spacer layer 200 can be as much as one-sixth (⅙) the final pitch, where the width (thickness) is a half pitch.

Figure 18:
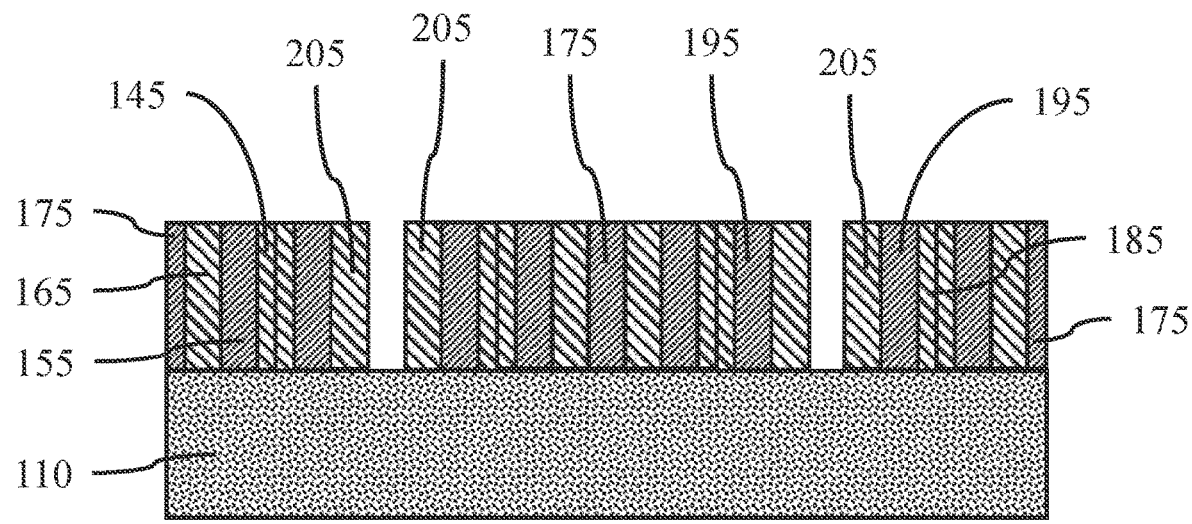
FIG. 18 is a cross-sectional side view showing portions of the seventh spacer layer removed to form seventh sidewall spacers on the plurality of sixth sidewall spacers, in accordance with an embodiment of the present invention.

FIG. 18 is a cross-sectional side view showing portions of the seventh spacer layer removed to form seventh sidewall spacers on the plurality of sixth sidewall spacers, in accordance with an embodiment of the present invention.

In one or more embodiments, portions of the seventh spacer layer 200 can be removed from the top surface of the metal layer 110 to form seventh sidewall spacers 205 on the plurality of sixth sidewall spacers 195. The portions of the seventh spacer layer 200 can be removed using a selective directional etch (e.g., RIE) to leave the portion of the seventh spacer layer 200 on the sidewalls of the sixth sidewall spacers 195.

Figure 19:
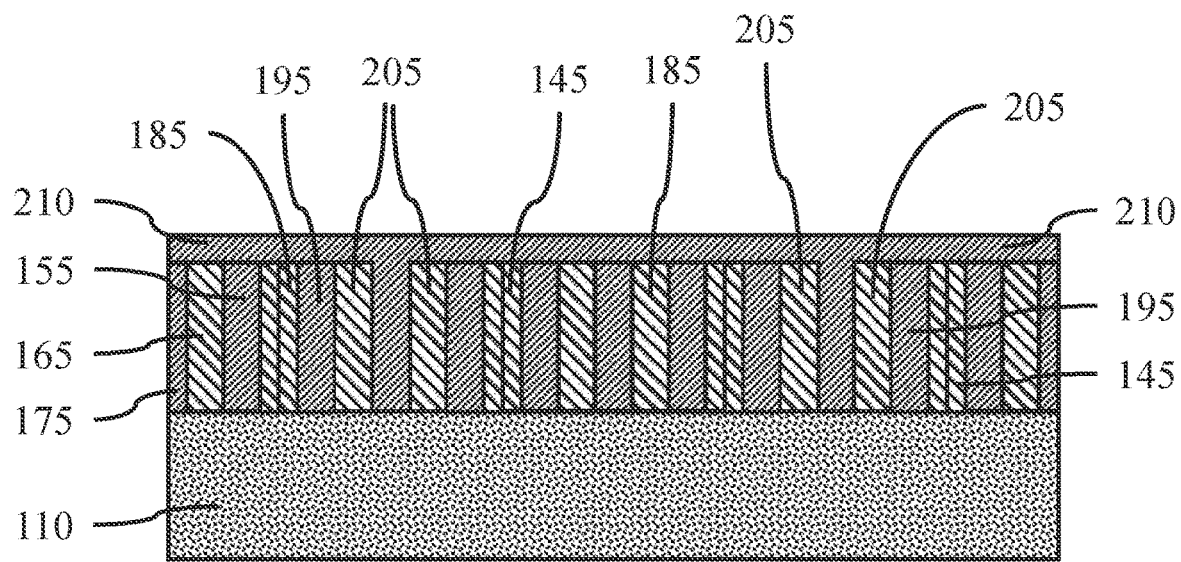
FIG. 19 is a cross-sectional side view showing an eighth spacer layer formed on the plurality of first, second, third, fourth, fifth, sixth, and seventh sidewall spacers, and exposed surfaces of the metal layer, in accordance with an embodiment of the present invention.

FIG. 19 is a cross-sectional side view showing an eighth spacer layer formed on the plurality of first, second, third, fourth, fifth, sixth, and seventh sidewall spacers, and exposed surfaces of the metal layer, in accordance with an embodiment of the present invention.

In one or more embodiments, an eighth spacer layer 210 can be formed on the plurality of third sidewall spacers 165, second sidewall spacers 155, first sidewall spacers 145, and exposed surfaces of the metal layer 110 between the seventh sidewall spacers 205. The eighth spacer layer 210 can be formed by a conformal deposition, for example, atomic layer deposition (ALD), plasma enhanced ALD (PEALD), and combinations thereof.

In various embodiments, the eighth spacer layer 210 can be made of a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), amorphous silicon (a-Si), amorphous carbon (a-C), a spin-on organic film/OPL, and combinations thereof. The material of the second spacer layer 150 can be selected based on etch electivity relative to the material(s) of the first spacer layer 140 and first sidewall spacers 145, and previously formed layers and features.

In various embodiments, the eighth spacer layer 210 can have a thickness in a range of about 0.5 nm to about 20 nm, or about 5 nm to about 10 nm, where the eighth spacer layer 210 can have a predetermined thickness intended to fill in the remaining fraction of the distance, W1, between the adjacent seventh sidewall spacers 205. In various embodiments, the eighth spacer layer 210 can be about the same thickness as the seventh sidewall spacers 205.

In various embodiments, the distance, W1, can be selected to be three times (3×) the final pitch, and the sidewall spacer thickness formed from the eighth spacer layer 210 can be half of the final pitch. Conversely, the thickness of the spacer thickness formed from the eighth spacer layer 210 can be as much as one-sixth (⅙) the final pitch, where the width (thickness) is a half pitch.

Figure 20:
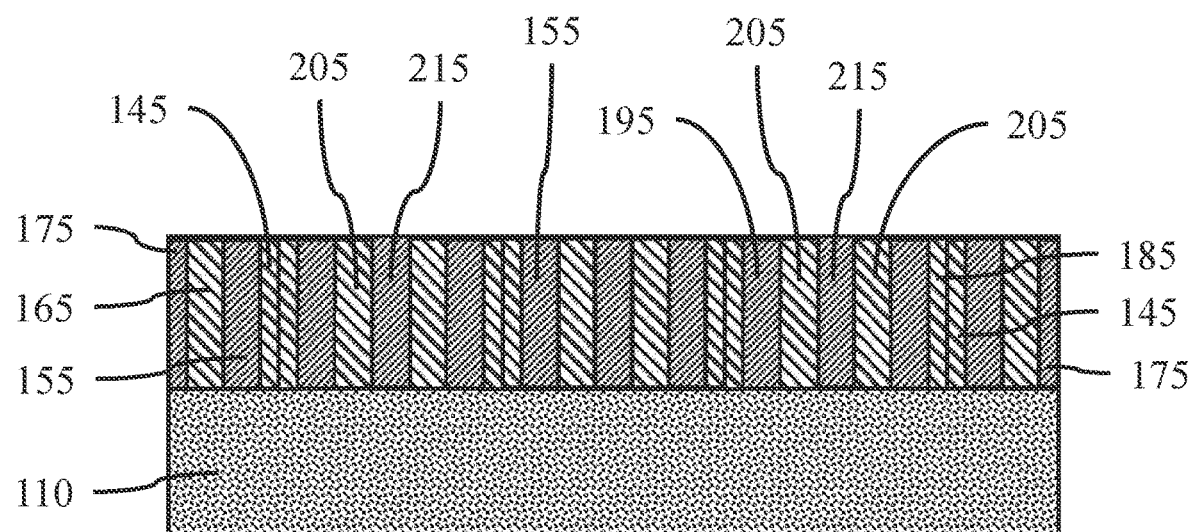
FIG. 20 is a cross-sectional side view showing portions of the eighth spacer layer removed to form eighth sidewall spacers in a gap between facing seventh sidewall spacers, in accordance with an embodiment of the present invention.

FIG. 20 is a cross-sectional side view showing portions of the eighth spacer layer removed to form eighth sidewall spacers in a gap between facing seventh sidewall spacers, in accordance with an embodiment of the present invention.

In one or more embodiments, portions of the eighth spacer layer 210 can be removed from the top surface of the metal layer 110 to form eighth sidewall spacers 215 on the plurality of seventh sidewall spacers 205. The portions of the eighth spacer layer 210 can be removed using a selective directional etch (e.g., RIE) to leave the portion of the eighth spacer layer 210 between the seventh sidewall spacers 205.

In one or more embodiments, a second set of sidewall spacers and the third set of sidewall spacers, each including fifth sidewall spacers 185, sixth sidewall spacers 195, seventh sidewall spacers 205, eighth sidewall spacers 215, can be formed on opposite sides of the first set of sidewall spacers 145, 155, 165, 175. Each of the second set of sidewall spacers and the third set of sidewall spacers can have the same width as the combination of first set of sidewall spacers, where the width, W1, is the same as the distance, D1. The second set (and third set) of sidewall spacers can also include a first subset of individual sidewall spacers, where the fifth sidewall spacers 185 and seventh sidewall spacers 205 can form the first subset, and a second subset of individual sidewall spacers, where sixth sidewall spacers 195 and eighth sidewall spacers 215 can form the second subset. The first subset of individual sidewall spacers can be made of a different material from the second subset first subset of individual sidewall spacers.

In various embodiments, the individual sidewall spacers (first sidewall spacers 145, second sidewall spacers 155, third sidewall spacers 165, fourth sidewall spacers 175, fifth sidewall spacers 185, sixth sidewall spacers 195, seventh sidewall spacers 205, eighth sidewall spacers 215) can have approximately the same widths.

In various embodiments, the pitch pattern can include an first set of sidewall spacers alternating with a second set of sidewall spacers, wherein each of the sidewall spacers have approximately the same width, and wherein the first set of sidewall spacers are a different material from the second set of sidewall spacers. Every multiple of sidewall spacers can also have the same width, which is a multiple of the widths of the individual sidewall spacers.

In various embodiments, the pattern of individual sidewall spacers can be transferred to the underlying metal layer 110, where one set of sidewall spacers can be removed, and the remaining set of sidewall spacers can be used as masks for forming metal lines from metal layer 110. In various embodiments, the second set of sidewall spacers can be configured to be selectively removed to leave the first set of sidewall spacers on the metal layer 110.

While the embodiments have been illustrated as having seven individual sidewall spacers, this is for representational purposes only, and other numbers of individual sidewall spacers are also contemplated. The number of individual sidewall spacers can be based on the width(s), W1, of the mandrels 125 and the widths of the individual sidewall spacers. Adjusting the widths and pitches of the mandrels 125 and sidewall spacers can provide for different spacings and patterns.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a pitch pattern, comprising:
   forming two adjacent mandrels separated by a first distance, D1, on a substrate;
   forming a first set of alternating sidewall spacers between the two adjacent mandrels;
   removing the two adjacent mandrels;
   forming a second set of alternating sidewall spacers after removing the two adjacent mandrels; and
   forming a third set of alternating sidewall spacers on opposite sides of the first set of sidewall spacers.

2. The method of claim 1, wherein the second set of sidewall spacers and the third set of sidewall spacers each have the same width as the first set of sidewall spacers.

3. The method of claim 1, wherein the second set of sidewall spacers and the third set of sidewall spacers are formed together by the same sequence of deposition processes.

4. The method of claim 1, wherein the two adjacent mandrels each have the same width in a range of about 3 nanometers (nm) to about 120 nm.

5. The method of claim 1, wherein the first distance, D1, separating the two adjacent mandrels is in a range of about 3 nanometers (nm) to about 120 nm.

6. The method of claim 1, wherein the first set of alternating sidewall spacers include an odd number of individual sidewall spacers.

7. The method of claim 6, wherein each of the individual sidewall spacers have a width in a range of about 0.5 nm to about 20 nm.

8. The method of claim 6, wherein a first subset of the individual sidewall spacers is made of a different material from a second subset of the individual sidewall spacers.

9. The method of claim 8, wherein the material of the first subset of the individual sidewall spacers and the material of the second subset of the individual sidewall spacers are both different from a material of the two adjacent mandrels.

10. A method of forming a pitch pattern, comprising:
forming two adjacent mandrels separated by a first distance, D1, on a substrate;
forming a first sidewall spacer on opposite sides of each of the two adjacent mandrels, wherein the first sidewall spacers are made of a first material;
removing the two adjacent mandrels;
forming a second sidewall spacer adjoining each of the first sidewall spacers after the removing the two adjacent mandrels, where the second sidewall spacers are made of a second material different from the first material;
forming a third sidewall spacer adjoining each of the second sidewall spacers, where the third sidewall spacers are made of the first material; and
forming a fourth sidewall spacer adjoining each of the third sidewall spacers, where the fourth sidewall spacers are made of the second material.

11. The method of claim 10, further comprising removing the two adjacent mandrels.

12. The method of claim 11, further comprising forming a fifth sidewall spacer on each of the first sidewall spacers.

13. The method of claim 10, wherein the first distance, D1, separating the two adjacent mandrels is in a range of about 3 nanometers (nm) to about 120 nm.

14. The method of claim 13, wherein the two adjacent mandrels each have the same width in a range of about 3 nanometers (nm) to about 120 nm.

15. The method of claim 14, wherein each of the first, second, third and fourth sidewall spacers have a width in a range of about 0.5 nm to about 20 nm.

* * * * *